(12) United States Patent
Kalb et al.

(10) Patent No.: US 9,133,704 B2
(45) Date of Patent: Sep. 15, 2015

(54) MAGNETO-OPTICAL SENSOR

(75) Inventors: Frederique Kalb, Boncourt (FR); Christine Aussibal, Villebon sur Yvette (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 1216 days.

(21) Appl. No.: 11/721,598

(22) PCT Filed: Dec. 13, 2005

(86) PCT No.: PCT/EP2005/013420
§ 371 (c)(1),
(2), (4) Date: Jun. 13, 2007

(87) PCT Pub. No.: WO2006/063808
PCT Pub. Date: Jun. 22, 2006

(65) Prior Publication Data
US 2009/0250213 A1    Oct. 8, 2009

(30) Foreign Application Priority Data

Dec. 13, 2004  (EP) .................................... 04292977

(51) Int. Cl.
*E21B 47/09*  (2012.01)
*G01R 33/032*  (2006.01)

(52) U.S. Cl.
CPC ........ *E21B 47/0905* (2013.01); *G01R 33/0322* (2013.01)

(58) Field of Classification Search
CPC ............... E21B 47/09; E21B 47/0905; E21B 11/10532; G11B 11/105
USPC .................. 166/250.01, 254.2, 65.1, 66, 66.5, 166/242.2; 369/112.16–112.19; 428/810, 428/815–816, 692.1, 693.1, 817–825.1, 428/800; 360/114.01–114.09; 324/224.1, 324/244, 260

See application file for complete search history.

(56) References Cited

U.S. PATENT DOCUMENTS

| 4,320,340 | A |   | 3/1982 | Lichtenberg et al. | |
| 4,609,961 | A | * | 9/1986 | Jacobs ..................... | 360/114.05 |

(Continued)

FOREIGN PATENT DOCUMENTS

WO     WO03042498     5/2003

OTHER PUBLICATIONS

M.J. Dudziak, "Structural integrity inspection and monitoring by magnetooptic sensors," Proceedings of the SPIE —The International Society for Optical Engineering SPIE—Int. Soc. Opt. Eng USA, vol. 3525, 1998 pp. 369-380.

(Continued)

*Primary Examiner* — Shane Bomar
*Assistant Examiner* — Elizabeth Gitlin
(74) *Attorney, Agent, or Firm* — Stephanie Chi; Jody DeStefanis

(57) ABSTRACT

A magneto-optic sensor for oilfield application, the sensor (1, 1', 101, 101') receives an incident beam IB, $IB_A$, $IB_B$, $IB_C$, $IB_D$ and comprises a polarizing element (3, 103) for providing a determined state of polarization beam and a Faraday rotator (4, 104) for providing a response beam having a modified state of polarization. The sensor provides a response beam (RB, $RB_A$, $RB_B$, $RB_C$, $RB_D$) having an intensity dependent on an external magnetic field representative of a particular characteristic of a well-bore casing CC, CR applied on the Faraday rotator (4, 104).

17 Claims, 9 Drawing Sheets

(56) References Cited

U.S. PATENT DOCUMENTS

| | | | |
|---|---|---|---|
| 5,206,924 A * | 4/1993 | Kersey | 385/24 |
| 5,323,856 A | 6/1994 | Davis et al. | |
| 5,344,720 A * | 9/1994 | Belt et al. | 428/821 |
| 6,032,739 A | 3/2000 | Newman et al. | |
| 2003/0052670 A1* | 3/2003 | Miszewski | 324/228 |
| 2004/0056655 A1* | 3/2004 | Sekijima et al. | 324/244.1 |

OTHER PUBLICATIONS

International search report for the equivalent PCT patent application No. PCT/EP2005/013420 issued on Feb. 3, 2006.

* cited by examiner

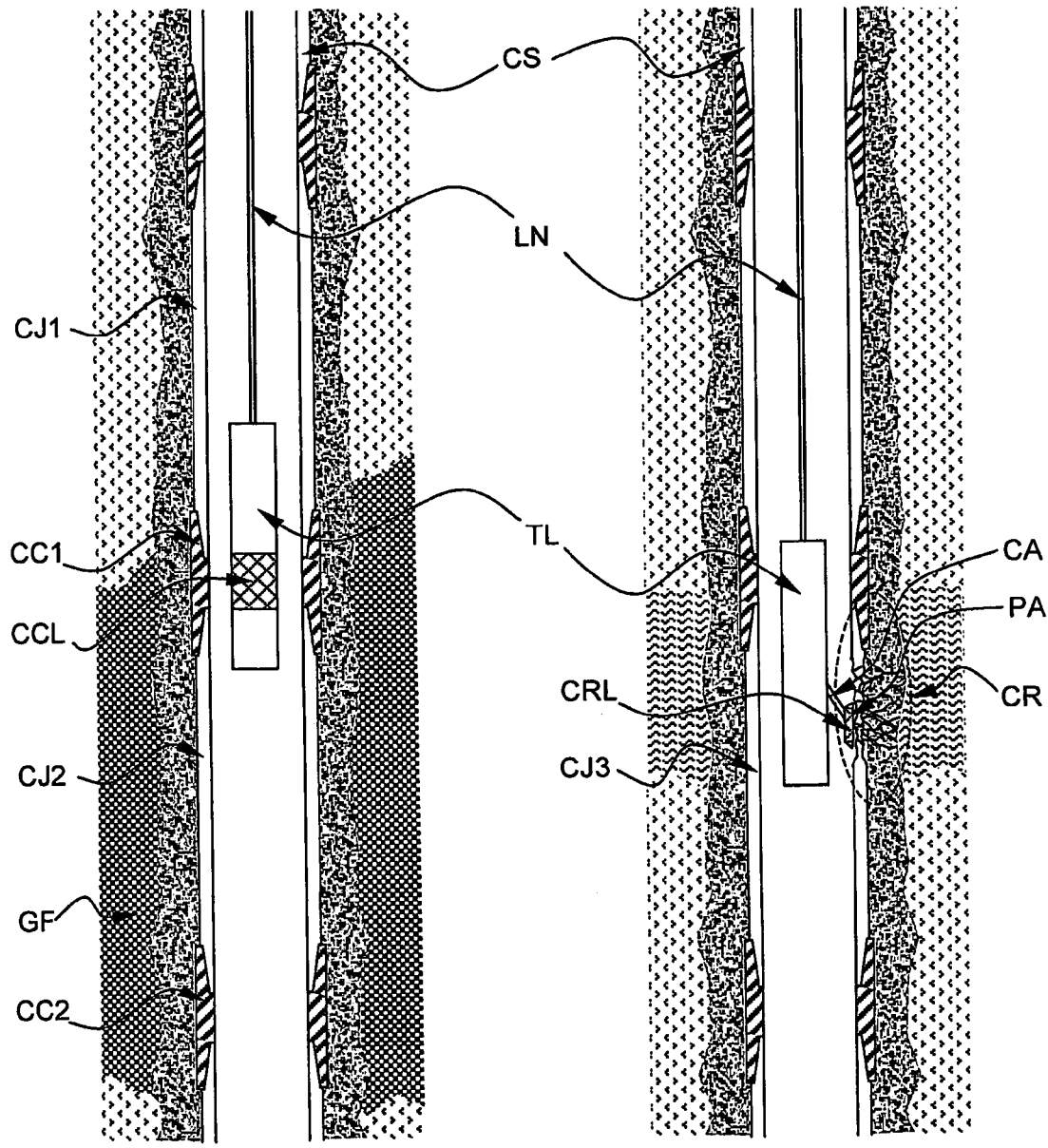
Figure 2.A  Figure 2.B

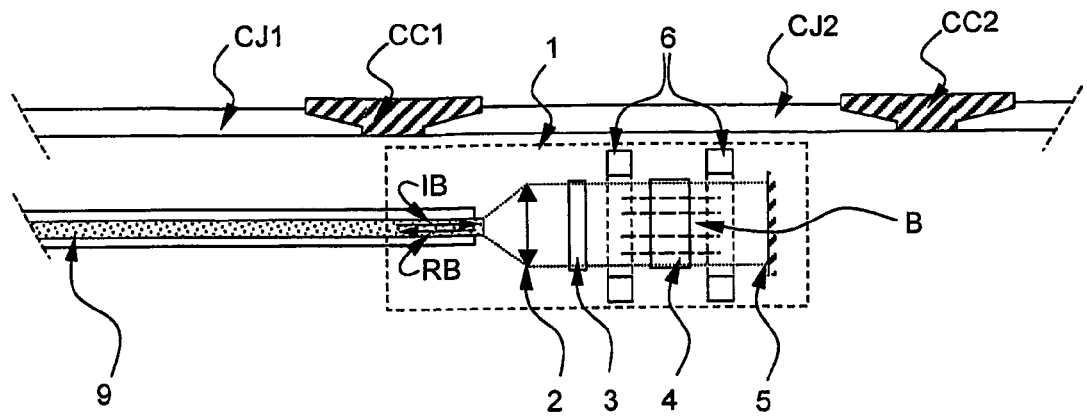
Figure 3.A
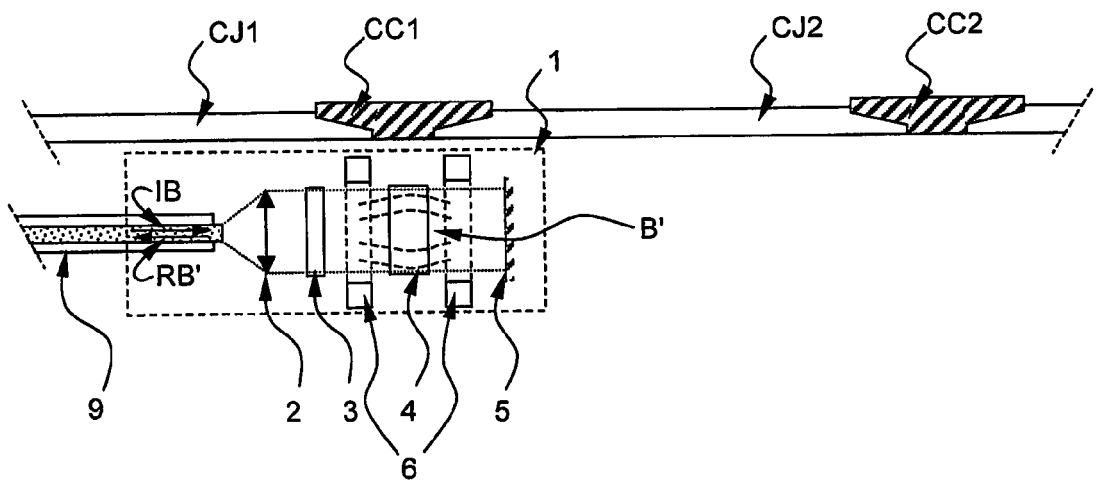
Figure 3.B
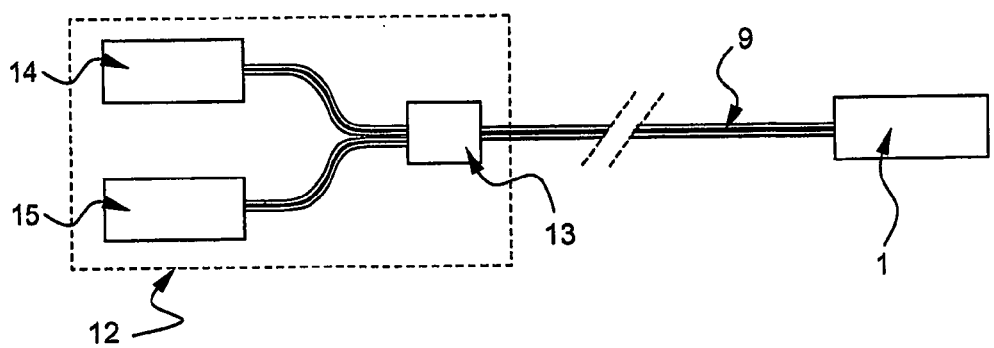
Figure 3.C

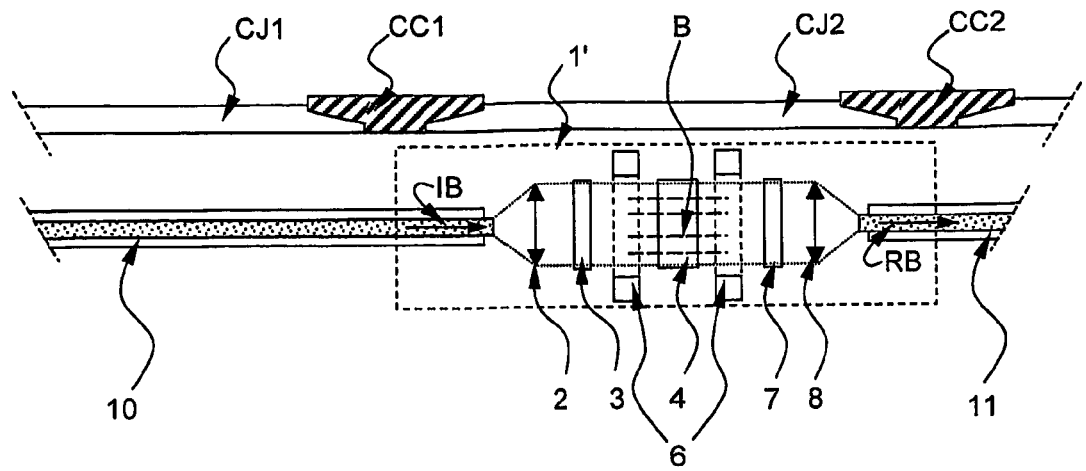
Figure 4.A
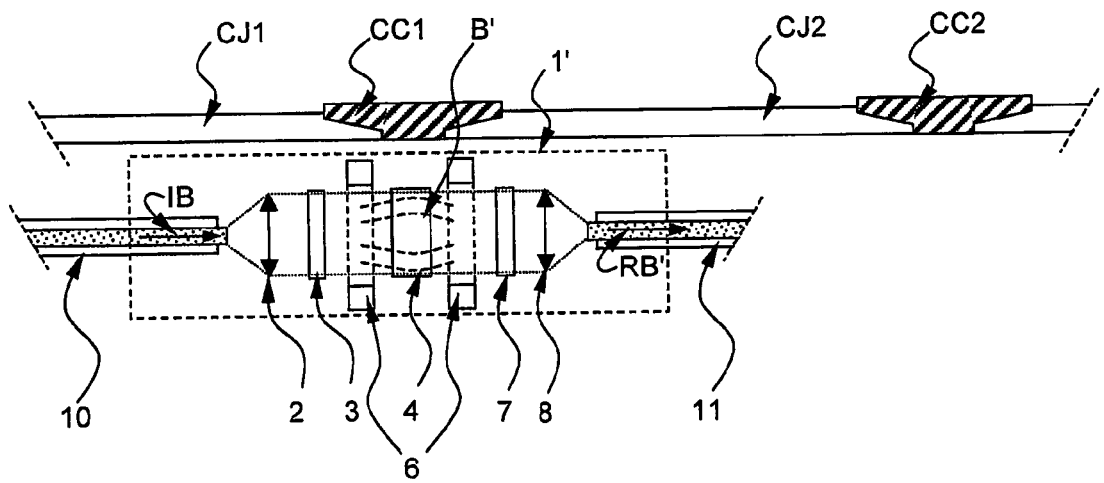
Figure 4.B
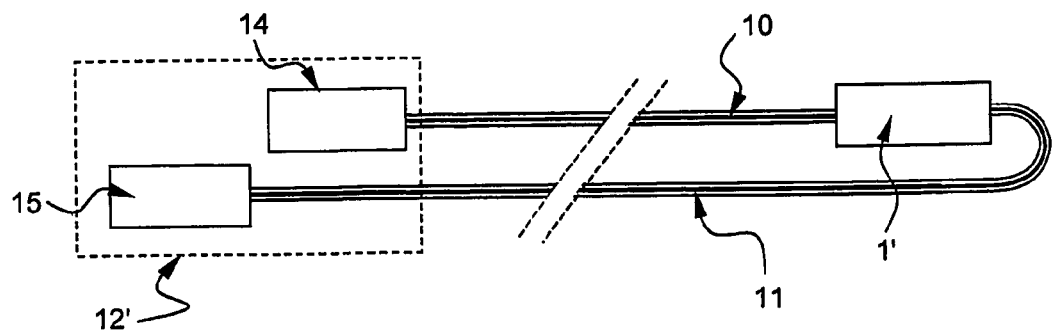
Figure 4.C

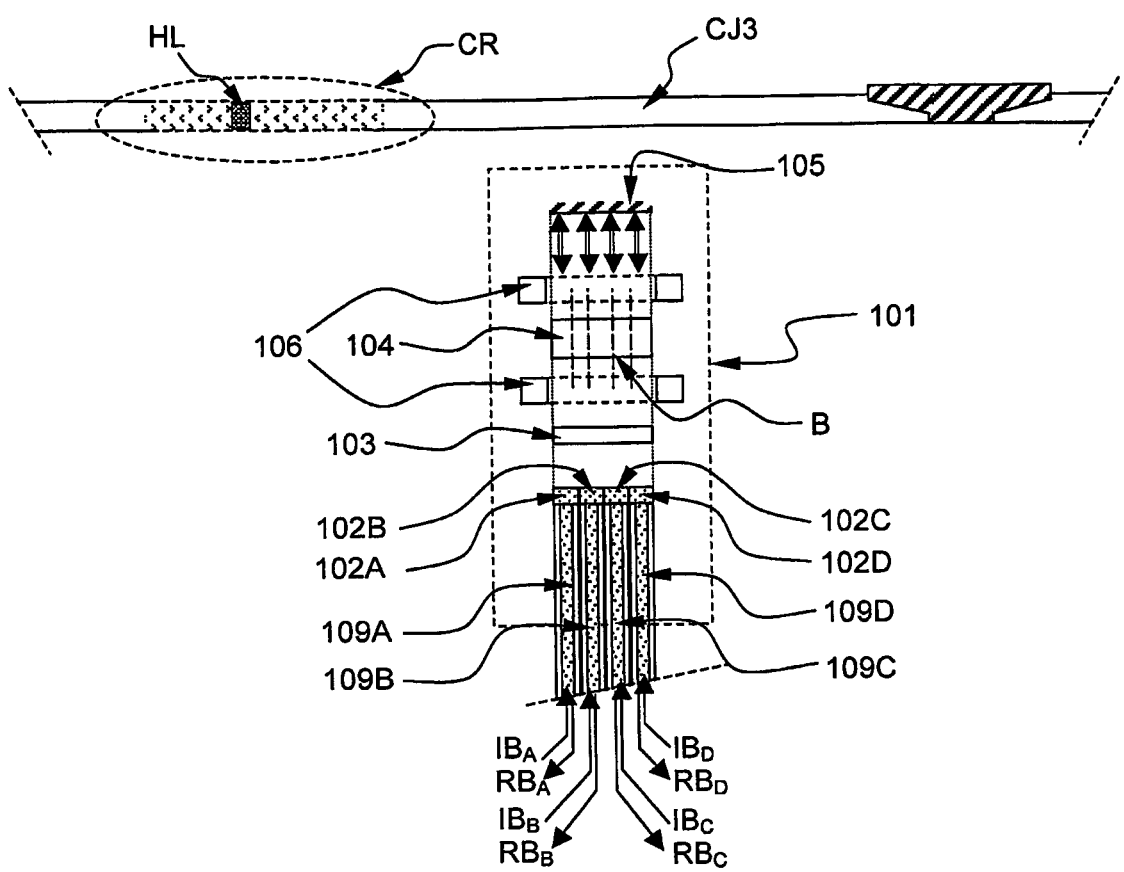
Figure 5.A

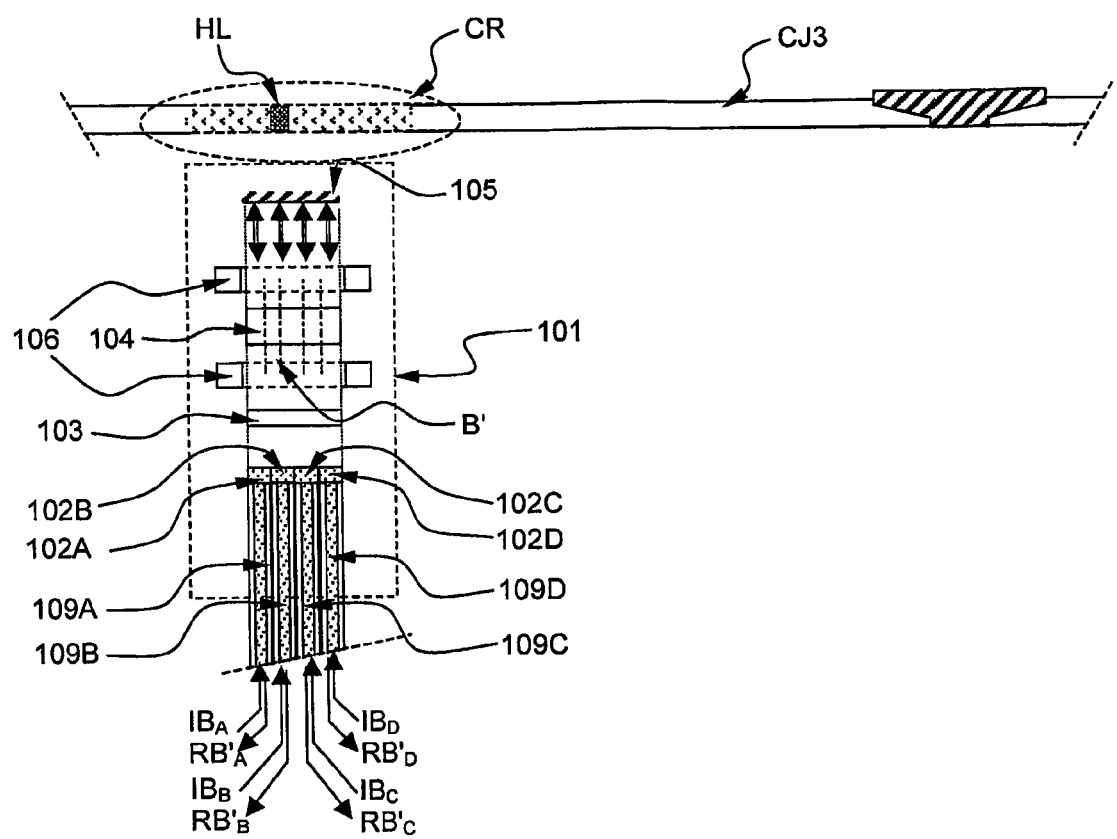
Figure 5.B

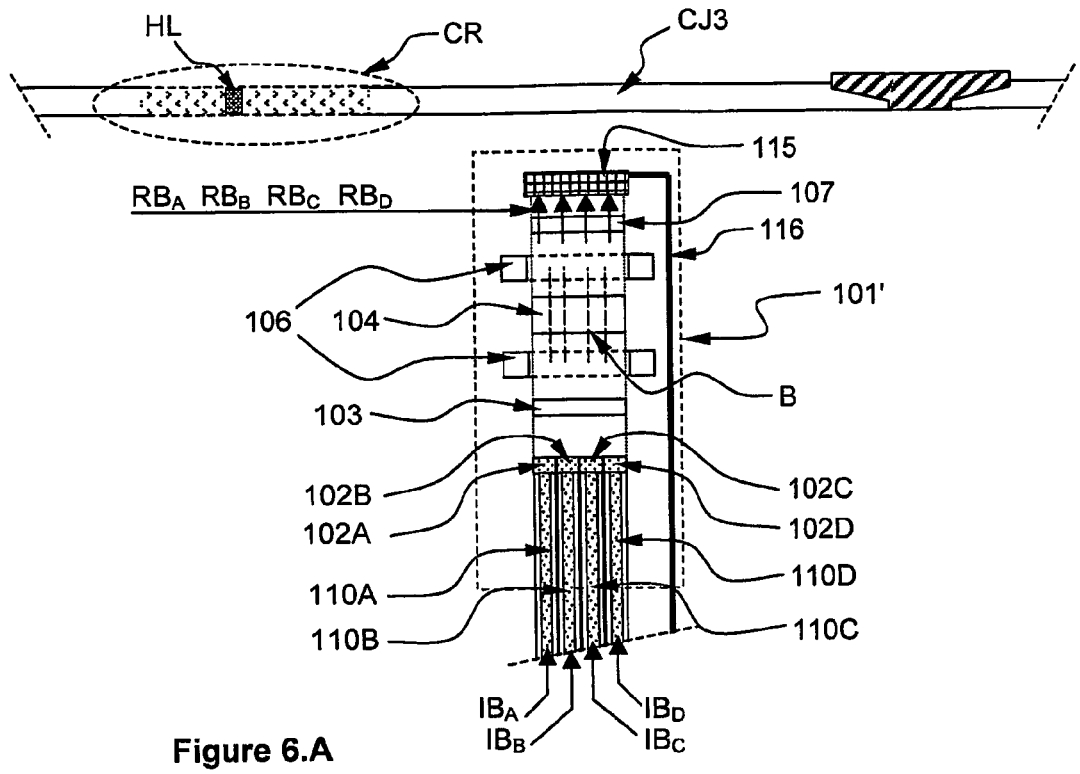
Figure 6.A
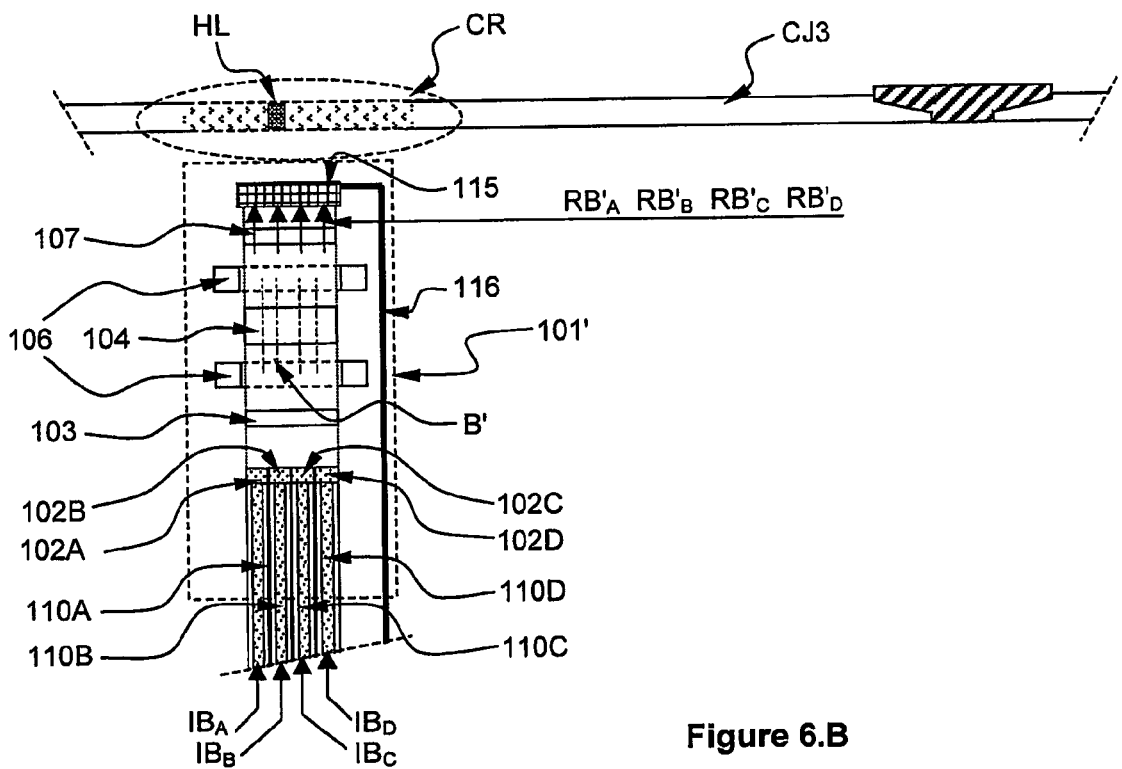
Figure 6.B

MAGNETO-OPTICAL SENSOR

FIELD OF THE INVENTION

The invention relates to magneto-optical sensors designed for applications in the oilfield industry. In particular, the invention relates to a casing collar locator and to a corrosion locator comprising such magneto-optical sensors. The invention also relates to a logging tool comprising such casing collar locator and/or a corrosion locator.

BACKGROUND OF THE INVENTION

FIG. 1 schematically shows a typical onshore hydrocarbon well location and surface equipments SE above a hydrocarbon geological formation GF after drilling operation has been carried out, after a casing string CS has been run and after cementing operations have been carried out for sealing the annulus CA (i.e. the space between the well-bore WB and the casing string CS).

Typically, the casing string CS comprises a plurality of casing joints CJ, two casing joints being coupled together by a casing collar CC. The casing string function is to stabilize the well-bore.

The casing joint CJ is a length of steel pipe, generally around 13 m or 40 ft long with an externally threaded (male thread form) connection at each end. Casing joints are assembled to form a casing string of the correct length and specification for the well-bore in which it is installed.

The casing collar CC is an internally threaded (female thread form) short length of pipe used to connect two casing joints. The resulting connection must provide adequate mechanical strength to enable the casing string to be run and cemented in place. The casing collar must also provide sufficient hydraulic isolation under the design conditions determined by internal and external pressure conditions and fluid characteristics.

The casing may be made of plain carbon steel, stainless steel or other material in order to withstand a variety of forces, such as collapse, burst, and tensile failure, as well as chemically aggressive fluid. Nevertheless, in harsh environment, the casing may be subject to corrosion that may affect its functionality.

At this stage, well logging operation may be carried out. The well logging operation serves to measure various parameters of the hydrocarbon well geological formation (e.g. resistivity, porosity, etc. . . . at different depths) and in the well-bore (e.g. temperature, pressure, fluid type, fluid flowrate, etc. . . . at different depths). Such measurements are performed by a logging tool TL. Generally, a logging tool comprises at least one sensor (e.g. resistivity sonde, mechanical sonde, gamma ray neutron sonde, accelerometer, pressure sensor, temperature sensor, etc. . . . ) and measures at least one parameter. It may include a plurality of same or different sensors sensitive to one or more parameters. The logging tool is moved up and down in the borehole for gathering data about the various parameters by means of a cable LN. The cable may be a mechanical cable, an electrical cable or an electro-optical cable comprising a fiber line protected against potential harsh environment existing in the well-bore. The mechanical, electrical, or electro-optical cable transmits electrical signals or optical signals from the logging tool to the surface unit.

The logging tool may be deployed inside the well-bore by an adapted surface equipment SE that may include a vehicle SU and an adapted deploying system, e.g. a drilling rig DR or the like. Data related to the hydrocarbon geological formation GF or to the well-bore WB gathered by the logging tool TL may be transmitted in real-time to the surface, for example to the vehicle fitted with an appropriate data collection and analysis computer and software.

In particular, a logging tool TL may comprise a casing collar locator tool. Such a locator is used to confirm or correlate depth by using known reference points on the casing string. A known casing collar locator is an electrical logging tool that detects the known casing features such as pup joints installed for correlation purposes (measurement of the voltage across a spool in the presence of magnet). The casing collar locator tool provides a casing collar log that generally incorporates a gamma ray log to correlate the relative position of casing string features, such as the location of a particular pup joint, with the reservoir or formation of interest. Such a locator lacks of sensitivity in particular in casing having an important diameter.

SUMMARY OF THE INVENTION

One goal of the invention is to propose a magneto-optical sensor designed for applications in the oilfield industry, in particular a casing collar locator and a corrosion locator that is more sensitive than prior art locator.

A second alternative goal of the invention is to propose a magneto-optical sensor designed for applications in the oilfield industry that has a better resolution than prior art locator.

A third alternative goal of the invention is to propose a magneto-optical sensor designed for applications in the oilfield industry that is reliable in harsh down-hole environment (e.g. high temperature, high pressure . . . ).

According to the invention, a magneto-optic sensor for oilfield application, the sensor receiving an incident beam, comprises a polarizing element for providing a determined state of polarization beam, and a Faraday rotator for providing a response beam having a modified state of polarization. The Faraday rotator provides a response beam having a modified state of polarization dependent on an external magnetic field applied on the Faraday rotator, said external magnetic field being representative of a particular characteristic of a well-bore casing. The response beam intensity is modulated in correlation with the particular characteristic of a well-bore casing.

The particular characteristic may be a casing collar coupling a first casing joint to a second casing joint, or a corroded casing joint.

The sensor may further comprise a determined magnetic field generator for submitting the Faraday rotator to a constant or determined variable magnetic field. The determined magnetic field generator can be a permanent magnet or a transmitter coil.

The sensor may further comprise a beam shaping element for shaping the incident beam onto the polarizing element. The beam shaping element may be a collimator, a focuser, a lens or a particular extremity of an optical fiber.

The magneto-optic sensor for oilfield application is coupled to an electronic unit, the electronic unit comprising a source providing the incident beam to the sensor. The electronic unit may also comprise a detector receiving the response beam from the sensor. Alternatively, the detector can be positioned directly in the sensor.

According to a first embodiment, the magneto-optic sensor for oilfield application is coupled to an electronic unit by an optical fiber. The electronic unit comprises a source providing the incident beam carried by the optical fiber to the sensor and a detector receiving the response beam carried by the optical fiber from the sensor, the source and the detector being coupled to the optical fiber by a coupler. The sensor further comprises a reflective element for reflecting the response beam to the optical fiber (for example the reflective element is a corner cube reflector).

According to a second embodiment, the magneto-optic sensor for oilfield application comprises an analyzing element and is coupled to an electronic unit by a first and a second optical fiber. The electronic unit comprises a source providing the incident beam carried by the first optical fiber to the sensor and a detector receiving the response beam carried by the second optical fiber from the sensor.

According to a third and fourth embodiments, the magneto-optic sensor for oilfield application is coupled to an electronic unit by at least two optical fibers, the electronic unit comprises at least one source providing at least two incident beams respectively carried by the at least two optical fibers to the sensor. The sensor provides at least two response beams having an intensity dependent on the external magnetic field representative of a particular characteristic of the well-bore casing locally applied on the Faraday rotator.

According to the third embodiment, the magneto-optic sensor further comprises a reflective element for reflecting the response beams to the optical fibers.

According to the fourth embodiment, the magneto-optic sensor further comprises an analyzing element and the at least one detector receiving the response beams is positioned within the sensor.

Advantageously, for the third and fourth embodiments, the sensor has a main axis positioned sensibly perpendicularly to a well-bore main axis at the level where the external magnetic field representative of the particular characteristic of the well-bore casing is measured.

The invention also relates to a casing collar locator comprising a housing fitted with a magneto-optic sensor of the invention, the magneto-optic sensor providing a first response signal when the magneto-optic sensor is positioned along to a casing joint and a second response signal when the magneto-optic sensor is positioned close by a casing collar.

The invention also relates to a corrosion locator comprising a housing fitted with a magneto-optic sensor of the invention, the magneto-optic sensor providing a first response signal when the magneto-optic sensor is positioned along a normal state casing joint and a second response signal when the magneto-optic sensor is positioned close by a corroded state casing joint.

The invention also relates to a logging apparatus comprising a tool coupled to a surface unit by a line and adapted to be deployed in a well-bore, the tool comprising at least one casing collar locator according to the invention or at least one corrosion locator according to the invention.

Finally, the invention also relates to a logging method for determining a particular characteristic of a well-bore casing, the method comprising the steps of deploying a logging apparatus comprising a tool coupled to a surface unit by a line in a well-bore. The method further comprises the step of detecting the particular characteristic of the well-bore casing by at least one casing collar locator according to the invention or at least one corrosion locator according to the invention.

Advantageously, the magneto-optical sensor of the invention can be miniaturized, thus being well adapted for oilfield down-hole applications. In particular, the sensor can be packaged in a reduced size housing and integrated in the arm of a caliper, of a centralizer or of a tool and positioned close to the casing wall, thus improving the measurement sensitivity. The magneto-optical sensor is also characterized by a higher spatial resolution relatively to electrical sensor.

It is also possible to deport the electronic unit controlling the magneto-optical sensor of the invention so that the sensor can be remotely controlled through an optical fiber. Thus, the magneto-optical sensor of the invention is reliable and well adapted to perform measurement in harsh environment where usual electronic component functioning is affected.

The magneto-optical sensor of the invention is suitable both for permanent monitoring and for logging applications.

BRIEF DESCRIPTION OF THE DRAWINGS

The present invention is illustrated by way of example and not limited to the accompanying figures, in which like references indicate similar elements:

FIG. 2.A schematically shows a casing collar locator according to the invention;

FIG. 2.B schematically shows a corrosion locator according to the invention;

FIGS. 3.A, 3.B and 3.C schematically illustrate the magneto-optic sensor according to a first embodiment of the invention;

FIGS. 4.A, 4.B and 4.C schematically illustrate the magneto-optic sensor according to a second embodiment of the invention;

FIGS. 5.A and 5.B schematically illustrate the magneto-optic sensor according to a third embodiment of the invention;

FIGS. 6.A and 6.B schematically illustrate the magneto-optic sensor according to a fourth embodiment of the invention;

DETAILED DESCRIPTION OF THE INVENTION

Figure 1:
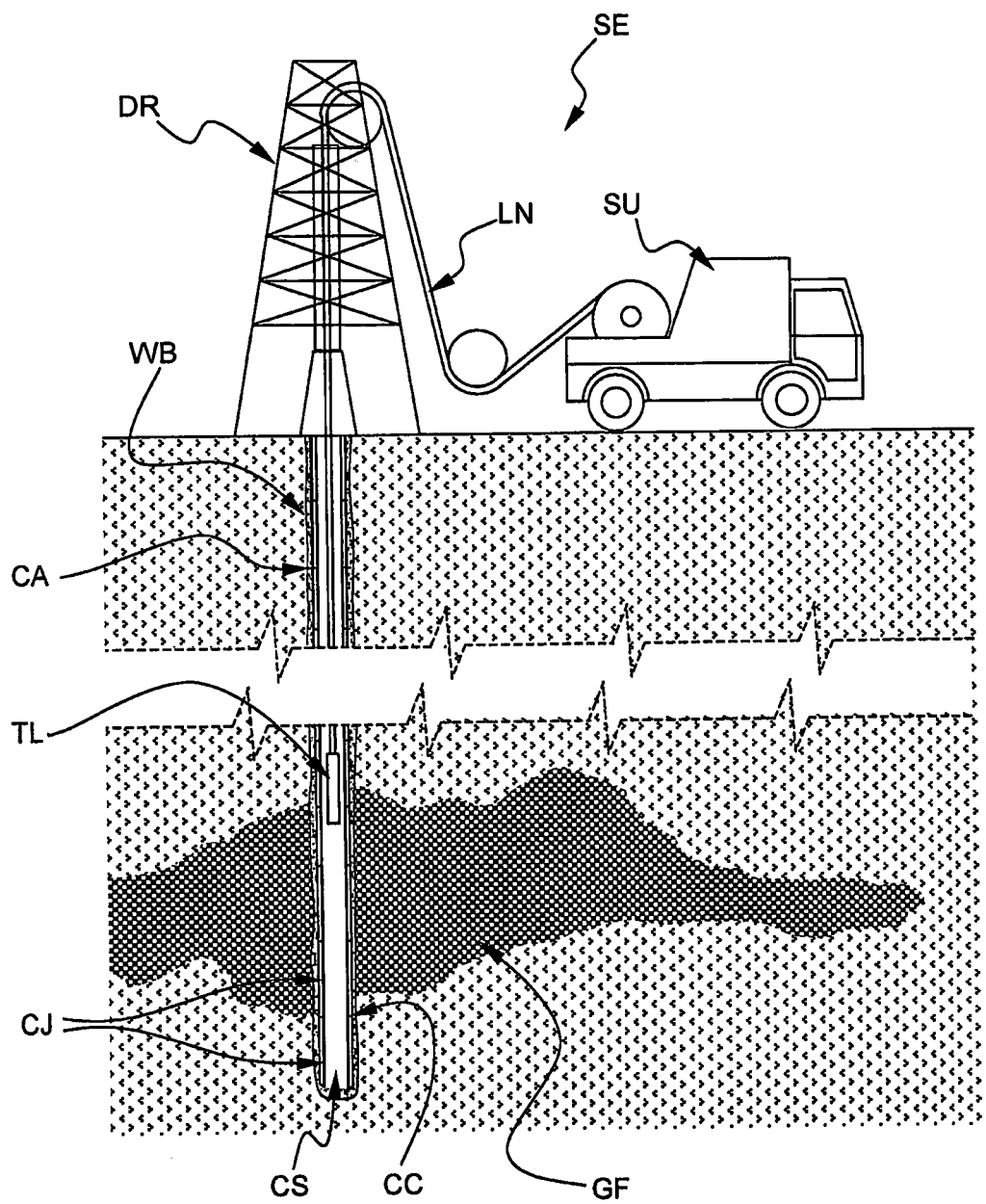
FIG. 1 schematically shows a typical onshore hydrocarbon well location.

FIG. 2.A schematically shows a magnified view of a portion of the cased well-bore of FIG. 1, wherein the tool TL comprises a casing collar locator CCL according to the invention. The casing collar locator detects the presence of a casing collar CC1 between a first casing joint CJ1 and a second casing joint CJ2 of the casing string CS. It also detects the presence of a second casing joint CJ2. The casing collar locator CCL comprises a magneto-optic sensor, which will be described in details hereinafter. By correlating these detection with other measurements made by the tool TL, it is possible to correlate the position of the geological formation GF of interest with the position of the casing joints CJ1, CJ2 (thus of the depth) for further geological formation measurements and/or exploitation operations. The tool TL provides the measurements to the surface equipment through the connection line LN. The computer and software of the surface equipment provides to the operators a log correlating the various measurements made by the other sensors of the tool to the position of the various casing joints.

FIG. 2.B schematically shows a magnified view of a portion of the cased well-bore of FIG. 1, wherein the tool TL comprises a corrosion locator CRL according to the invention. The corrosion locator may be fitted within a pad PA coupled to the tool by a arm CA. Such a corrosion locator can be deployed in order to be in close contact with the casing. The corrosion locator can detect the position, shape and dimension of a corrosion zone CR affecting a casing joint CJ3. The corrosion locator CRL comprises a magneto-optic sensor, which will be described in details hereinafter. The tool TL provides the measurements to the surface equipment through the connection line LN. By correlating this detection with depth measurements made by the tool TL, it is possible to run an appropriate tool down-hole for providing an appropriate treatment (e.g. chemical treatment or the like) for consolidating the corroded casing joint CJ3.

Alternatively, the casing collar locator or the corrosion locator may be fitted within one arm of a tool that can be deployed radially so as to be in contact with the well-bore wall. The tool may comprise a plurality of mechanical arms connected to the tool and may comprise a plurality of casing collar locators or corrosion locators. In this case, the magneto-optic sensor can be positioned very close to the casing string, thus improving its sensitivity to any variation of a surrounding magnetic field.

FIGS. 3, 4, 5 and 6 schematically illustrate the operation principle of the magneto-optic sensor of the casing collar locator CCL and of the corrosion locator CRL according to various embodiment of the invention. For the purpose of explaining the operation principle of the magneto-optic sensor and for clarity sake, it is to be noted that the different elements, in particular the sensor on the one side and a part of the casing on the other side are not shown according to the same scale on these Figures (in particular the sensor elements scale is exaggerated relatively to the casing elements scale). The magneto-optic sensor of the invention is based on the well known Faraday effect, namely the rotation of the plane of polarization of a incident light beam traveling through a Faraday rotator under the influence of an external magnetic field. By measuring the rotation of the plane of polarization of the incident light beam, it is possible to determine the external magnetic field. The Faraday effect is described by the following relationship:

$$\theta = B \times V \times l$$

where $\theta$ is the angle of polarization rotation, B is the magnetic field in Tesla, V is the Verdet constant for the Faraday rotator material, and $l$ is the effective length of material submitted to the magnetic field.

FIGS. 3.A, 3.B and 3.C schematically illustrate the magneto-optic sensor according to a first embodiment of the invention. The first embodiment relates to the magneto-optic sensor working in reflection.

The magneto-optic sensor 1 is coupled to an optical fiber 9 and receives an incident beam IB. The magneto-optic sensor 1 comprises a polarizing element 3, a Faraday rotator 4 and a reflective element 5. It may comprise a beam shaping element 2, for example a collimator, a focuser, a lens or a particular end of the optical fiber. It may also comprise a determined magnetic field generator 6, for example a permanent magnet.

The beam shaping element 2 is used to give a particular shape to the incident beam. For example, a beam shaping element 2 under the form of a collimator is used to collimate the incident beam, in particular on the Faraday rotator 4 and on the polarizer 3. Preferably, the beam shaping element 2 should transform the incident beam into a slightly convergent beam.

The polarizing element 3 may be a polarizer. The polarizer 3 attributes a determined state of polarization to the incident beam IB. It should be noted that the magneto-optic sensor 1 may not comprise any polarizing element when the optical fiber is a polarization maintaining type optical fiber transmitting a beam having a determined state of polarization.

The Faraday rotator 4 changes the state of polarization of the incident beam. The resulting state of polarization is dependent on an external magnetic field applied on the Faraday rotator, which is representative of a particular characteristic of a well-bore casing and also of the determined magnetic field applied by the determined magnetic field generator 6. In the example of FIG. 3, the particular characteristic of the well-bore casing is the casing collars CC1, CC2. The Faraday rotator is typically made of crystal materials, for example of the garnet family, like YIG (Yttrium Iron Garnet) with various substituting elements like Bismuth, or TGG (Terbium Gallium Garnet). Typically, a Garnet type crystal used for an oilfield application has a surface of around 1 to 2 mm² and a thickness of around 100 µm. Other materials like doped glasses (e.g. Terbium doped glasses), amorphous material, or Faraday rotating fiber may also be used provided that these materials have the property to non-reciprocally turn the polarization plane of the incident beam IB as a function of the external magnetic field.

The determined magnetic field generator 6 can be used to submit the Faraday rotator to a constant magnetic field in order to improve the sensitivity of the Faraday rotator to the external magnetic field (see FIGS. 6 and 7 hereinafter described). For example, the determined magnetic field generator 6 is a permanent magnet assembly comprising two hollow cylindrical magnets encompassing the Faraday rotator. The magnet assembly can be for example made in Samarium Cobalt material. Alternatively, the magnet assembly may have another form. Alternatively, the magnetic field generator 6 may be a spool arrangement with an appropriate alimentation circuit.

The magnetic field generator 6 can be designed so as to set the sensor operating point on a linear part of the sensor response curve (see FIG. 6), which optimizes the sensor sensitivity. Alternatively, the magnet can be designed so that the response beam provided by the sensor corresponds to a zero signal when the sensor is located close to a casing joint CJ1, CJ2 and a non-zero signal when the sensor is located close to a casing collar CC1, CC2.

The reflective element 5 reflects the response beam provided by the Faraday rotator back to the optical fiber 9. The reflective element 5 may be a flat mirror. Alternatively, the reflective element 5 may be a corner cube reflector. A corner cube reflector has the property to reflect the light parallel to incident direction independently of any change affecting alignment angle of the individual components of the magneto-optic sensor. Thus, it is advantageous for minimizing alignment issue.

The above mentioned individual components are positioned and secured in an appropriate housing through mechanical or gluing techniques.

The magneto-optic sensor according to the first embodiment operates as follows. The incident beam IB provided by the optical fiber 9 is collimated through the beam shaping element 2. The incident beam IB travels through the polarizer 3, the resulting beam being linearly polarized. Subsequently, the incident beam IB travels through the Faraday rotator 4 which rotates the polarization of the beam.

According to FIG. 3.A, the magneto-optic sensor 1 is positioned along a casing joint CJ2 between two casing collars CC1, CC2. The Faraday rotator 4 provides a beam which polarization is rotated by an angle of rotation $\theta$ depending on the permanent magnetic field B applied on the Faraday rotator. The resulting beam is reflected on the reflective element 5 and travels a second time through the Faraday rotator 4 which once again rotates the polarization of the beam. The beam resulting from the double traveling through the Faraday rotator has a polarization state rotated by an angle of rotation 2θ. Then, said beam travels through the polarizing element 3 which transmits only the polarization component corresponding to its polarization angle. The response beam RB intensity $I_r$ provided by the sensor is modified in correlation with the magnetic field applied on the Faraday rotator.

According to FIG. 3.B, the magneto-optic sensor 1 is positioned close by the casing collar CC1. The magnetic anomaly caused by the relatively high mass of the casing collar CC1 disturbs the determined magnetic field B and results in a different magnetic field B' applied on the Faraday rotator (with a variation of around 1 Gauss to a few Gauss). The Faraday rotator 4 provides a beam which polarization is rotated by a different angle of rotation θ'. The resulting beam is reflected on the reflective element 5 and travels a second time through the Faraday rotator 4 which once again rotates the polarization of the beam. The beam resulting from the double traveling through the Faraday rotator has a polarization state rotated by an angle of rotation 2θ'. After traveling through the polarizing element 3, the polarization component of the response beam RB has a modified intensity $I_r'$. Consequently, the proximity of a casing collar to the magneto-optic sensor 1 can be detected as a variation in the reflected intensity of the response beam.

As a first example, the Faraday rotator and/or the determined magnetic field B applied on the Faraday rotator may be chosen so as the sensor operating point is set on the linear part of the sensor response curve (see FIG. 7), which optimizes the sensor sensitivity.

As a second example, the Faraday rotator and/or the determined magnetic field B applied on the Faraday rotator may be chosen so as to induce a zero response beam when magneto-optic sensor 1 is positioned along the casing joints. In this case, the Faraday rotator and polarizer may turn the polarization so that the response beam RB is subject to a total extinction. When the magneto-optic sensor 1 is positioned close by the casing collar CC1, the perturbation of the magnetic field applied on the Faraday rotator generates a different rotation of the beam polarization. Consequently, the response beam RB' is not subject to a total extinction.

FIG. 3.C schematically shows a magneto-optic sensor with its associated electronic unit. The sensor 1 is coupled to the electronic unit 12 by an optical fiber 9. The electronic unit comprises a source 14 providing the incident beam IB carried by the optical fiber 9 to the sensor 1. The electronic unit also comprises a detector 15 receiving the response beam RB carried by the optical fiber 9 from the sensor. The detector 15 converts the received response beam into an electric current and further into data proportional to the intensity of the response beam. In this example, as the incident beam IB and the response beam RB are carried by the same optical fiber 9, the source and the detector are coupled to the optical fiber by a coupler 13. The source and the detector are coupled to an appropriate data collection and analysis computer and software (e.g. in the vehicle).

FIGS. 4.A, 4.B and 4.C schematically illustrate the magneto-optic sensor according to a second embodiment of the invention. The second embodiment relates to the magneto-optic sensor working in transmission.

The magneto-optic sensor 1' is coupled to a first optical fiber 10 and receives an incident beam IB. The magneto-optic sensor 1' comprises a polarizing element 3, a Faraday rotator 4, an analyzing element 7. It may comprise a first beam shaping element 2 and a second beam shaping element 8. It may also comprise a determined magnetic field generator 6, for example a permanent magnet. The magneto-optic sensor 1' is coupled to a second optical fiber 11 and provides a response beam RB to this second optical fiber.

The first beam shaping element 2, the polarizing element 3, the Faraday rotator 4 and the determined magnetic field generator 6 are analog to the ones described in relation with the first embodiment of the invention and will not be further described.

The analyzing element 7 is another polarizing element. For example, the analyzing element is an analyzer. Alternatively, the analyzing element may be constituted by a polarization maintaining type optical fiber. The Faraday rotator modifies the state of polarization of the beam in correlation with the magnetic field applied on the Faraday rotator. As the analyzing element 7 only transmits the polarization component that corresponds to its polarization angle, the response beam intensity is modulated in correlation with the external magnetic field applied to the Faraday rotator.

The second beam shaping element 8 is used for adapting the response beam for further transmission by the second optical fiber 11. For example, the second beam shaping element 8 may be a collimator used for focusing the response beam RB on the extremity of the second optical fiber 11.

The above mentioned individual components are positioned and secured in an appropriate housing through known mechanical or gluing techniques.

The magneto-optic sensor according to the second embodiment operates as follows. The incident beam IB provided by the first optical fiber 10 is shaped through the first beam shaping element 2. The incident beam IB travels through the polarizing element 3 and is linearly polarized. Subsequently, the incident beam IB travels through the Faraday rotator 4 which rotates the polarization of the incident beam IB. According to FIG. 4.A, the magneto-optic sensor 1' is positioned along a casing joint CJ2 between two casing collars CC1, CC2. The Faraday rotator 4 provides a beam which polarization is rotated by an angle of rotation θ depending on the permanent magnetic field B applied on the Faraday rotator. Then, said beam travels through the analyzing element 7 which transmits only the polarization component corresponding to its polarization angle. The resulting response beam RB has an intensity $I_r$ modified in correlation with the magnetic field applied on the Faraday rotator. The resulting response beam RB is shaped by the second beam shaping element 8. The sensor 1' provides the response beam RB to the second optical fiber 11.

According to FIG. 4.B, the magneto-optic sensor 1' is positioned close by the casing collar CC1. The magnetic anomaly caused by the relatively high mass of the casing collar CC1 disturbs the determined magnetic field B and results in a different magnetic field B' applied on the Faraday rotator (with a variation of around 1 to a few Gauss). The Faraday rotator 4 provides a beam which polarization is rotated by a different angle of rotation θ'. The resulting beam travels through the analyzing element 7 and a polarization component of a different intensity $I_r'$ is transmitted. Consequently, the proximity of a casing collar to the magneto-optic sensor 1' can be detected as a variation in the transmitted intensity of the response beam.

As a first example, the Faraday rotator and/or the determined magnetic field B applied on the Faraday rotator and/or the position of the analyzing element may be chosen so as to set the sensor operating point on the linear part of the sensor response curve (see FIG. 7), which optimizes the sensor sensitivity.

As a second example, the Faraday rotator and/or the determined magnetic field B applied on the Faraday rotator and/or the position of the analyzing element may be chosen so as to induce a response beam having zero intensity when magneto-optic sensor 1' is positioned along the casing joints. In this case, the response beam RB is subject to a total extinction after traveling through the Faraday rotator. When the magneto-optic sensor 1' is positioned close by the casing collar CC1, the change in the magnetic field applied on the Faraday rotator generates a rotation of polarization so that the response beam RB' is not subject to a total extinction.

FIG. 4.C schematically shows a magneto-optic sensor with its associated electronic unit. The sensor 1' is coupled to the electronic unit 12' by the first optical fiber 10 and the second optical fiber 11. The electronic unit comprises a source 14 providing the incident beam IB carried by the first optical fiber 10 to the sensor 1'. The electronic unit also comprises a detector 15 receiving the response beam RB carried by the second optical fiber 11 from the sensor. The detector 15 converts the received response beam into an electric current and further into data proportional to the intensity of the response beam. The source and the detector are coupled to an appropriate data collection and analysis computer and software (e.g. in the vehicle).

The electronic unit 12, 12' of the first and second embodiment can be positioned into the surface unit SU (long deport configuration) or alternatively into the tool TL itself (short deport configuration). As the sensitivity of the Faraday rotator is wavelength dependent (sensitivity increases as wavelength decreases), the choice of the incident beam wavelength depends on the chosen configuration.

In the long deport configuration alternative, the magneto-optical sensor can be interrogated all-optically and remotely from the surface unit. Preferably, the incident beam has a wavelength in the infra-red IR domain because of lower optical fiber attenuation.

In the short deport configuration alternative, the electronic unit delivers an electrical signal that can be processed and sent to surface by known telemetry systems. In that case, the incident beam may have a wavelength in the visible domain. Advantageously, the magneto-optic sensor is more sensitive and even small variation of the external magnetic field can be detected.

Figure 7:
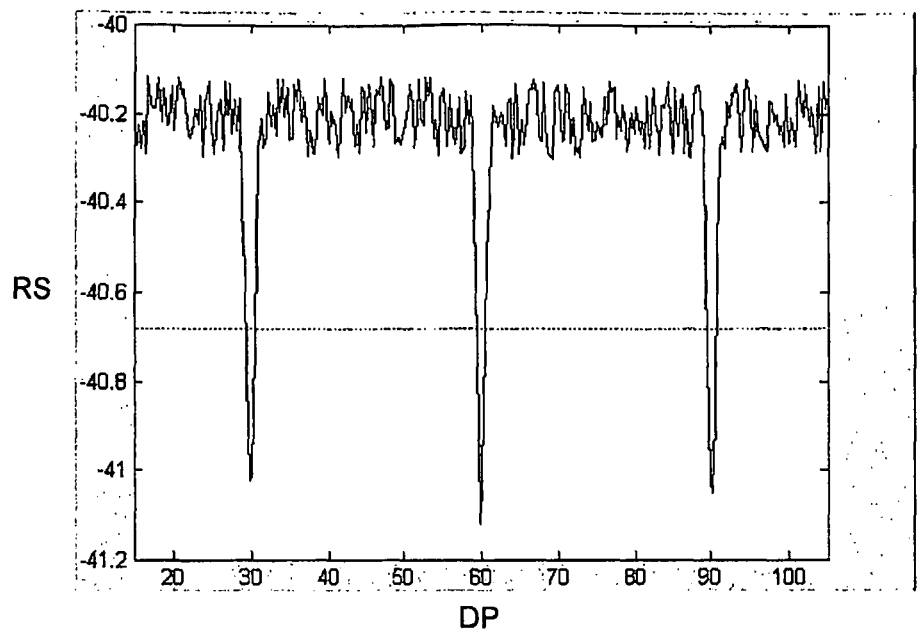
FIG. 7 shows the response signal provided by a casing collar locator according to the invention.

FIG. 7 typically shows the response signal RS versus depth DP, the response signal being provided by a casing collar locator comprising a magneto-optic sensor according to the first or second embodiment of the invention. In this particular example, the response signal provided by the casing collar locator shows no variation when the casing collar locator is positioned along the casing joints, and a 0.8 dB variation when the casing collar locator is positioned close to the casing collars. Thus, the position of the casing collars can be determined with precision.

FIGS. 3 and 4 have been hereinbefore described with a particular focus of a magneto-optic sensor implemented in a casing collar locator. However, it is apparent for a man skilled in the art that the same magneto-optic sensor can also be implemented in a corrosion locator. Thus, the various embodiments of the magneto-optic sensor of the invention operate in an identical manner for detecting the magnetic anomaly created by a corroded casing joint and will not be further described.

FIGS. 5.A and 5.B schematically illustrate the magneto-optic sensor according to a third embodiment of the invention. The third embodiment relates to a magneto-optic sensor working in reflection coupled to a plurality of optical fibers.

The magneto-optic sensor 101 is coupled to a first 109A, second 109B, third 109C and fourth 109D optical fibers and respectively receives a first $IB_A$, second $IB_B$, third $IB_C$ and fourth $IB_D$ incident beam. The magneto-optic sensor 101 comprises a polarizing element 103 (e.g. a polarizer), a Faraday rotator 104, and a reflective element 105. It may comprise a plurality of beam shaping elements 102A, 102B, 102C, 102D coupled to the respective optical fiber 109A, 109B, 109C, 109D. The beam shaping elements may be for example collimators, focusers, lenses or particular extremities of the respective optical fibers 109A, 109B, 109C, 109D. For example, they may be designed to focus the respective incident beams onto the faraday rotator. The sensor may also comprise a determined magnetic field generator 106, for example a transmitter coil.

The sensor 101 is coupled to an electronic unit (not shown) by the optical fibers 109A, 109B, 109C, 109D. The electronic unit is sensibly analog to the one described in relation with FIG. 3.C and comprises at least one source providing the incident beams $IB_A$, $IB_B$, $IB_C$, and $IB_D$ carried by optical fibers 109A, 109B, 109C, 109D to the sensor 101. The electronic unit also comprises a detector receiving the response beams $RB_A$, second $RB_B$, third $RB_C$ and fourth $RB_D$ response beam carried by the optical fibers 109A, 109B, 109C, 109D from the sensor. The detector provides a signal that can be processed in order to show an "image" representative of the local magnetic field. The detector may be a charged coupled device CCD or a plurality of detectors, each detector being associated with one optical fiber.

The polarizing element 103, the Faraday rotator 104, the determined magnetic field generator 106 and the reflective element 105 are analog to the ones described in relation with the first embodiment of the invention and will not be further described. The above mentioned individual components are positioned and secured in an appropriate housing through known mechanical or gluing techniques.

The magneto-optic sensor according to the third embodiment operates as follows. The first $IB_A$, second $IB_B$, third $IB_C$ and fourth $IB_D$ incident beams respectively provided by the first 109A, second 109B, third 109C and fourth 109D optical fibers are respectively shaped through the beam shaping elements 102A, 102B, 102C, 102D. The first $IB_A$, second $IB_B$, third $IB_C$ and fourth $IB_D$ incident beams travel through the polarizing element 103 and are linearly polarized. Subsequently, the first $IB_A$, second $IB_B$, third $IB_C$ and fourth $IB_D$ incident beams travel through the Faraday rotator 104 which rotates the polarization of the first $IB_A$, second $IB_B$, third $IB_C$ and fourth $IB_D$ incident beams.

According to FIG. 5.A, the magneto-optic sensor 101 is positioned along a casing joint CJ3. The Faraday rotator 104 provides a plurality of beams which polarizations are rotated by an angle of rotation θ depending on the permanent magnetic field B applied on the Faraday rotator. Then, said beams are reflected on the reflective element 105 and travel a second time through the Faraday rotator 104 rotating once again the polarization state of the beams. The beams resulting from the double traveling through the Faraday rotator have a polarization state rotated by an angle of polarization 2θ. Finally, said beams travel through the polarizing element 103 transmitting only the polarization components corresponding to its polarization angle. The resulting first $RB_A$, second $RB_B$, third $RB_C$ and fourth $RB_D$ response beam respectively have an intensity $I_{rA}, I_{rB}, I_{rC}, I_{rD}$ modified in correlation with the magnetic field locally applied on the Faraday rotator. The first $RB_A$, second $RB_B$, third $RB_C$ and fourth $RB_D$ response beam are transmitted by the respective optical fibers onto the detector. Typically, in case of a normal casing, the detector may show a uniform "image" of the casing.

According to FIG. 5.B, the magneto-optic sensor 101 is positioned close by a corroded zone CR. The magnetic anomaly caused by the corroded zone CR disturbs the determined magnetic field B and results in a different magnetic field B' applied on the Faraday rotator. Locally, the magnetic field B' may differ substantially due to particular anomaly, for example a hole HL in the casing. The Faraday rotator 104 provides a plurality of beams which polarizations are rotated by a different angle of rotation depending on the local magnetic field applied on the Faraday rotator. The resulting beams are reflected on the reflective element 105 and travel a second time through the Faraday rotator 104, which once again rotates the polarization state of the beams. After traveling through the polarizing element 103, the response beams $RB'_A$, $RB'_B$, $RB'_C$ and $RB'_D$ have a modified intensity $I_{rA}'$, $I_{rB}'$, $I_{rC}'$, $I_{rD}'$ respectively. Consequently, the proximity of a corroded zone to the magneto-optic sensor 1 can be detected as a variation in the transmitted intensity of the response beams $RB'_A$, $RB'_B$, $RB'_C$, $RB'_D$. Typically, in case of a corroded casing, the detector may show a non-uniform "image" of the casing. The position, the shape and the dimensions of the corroded zone CR can be determined with a high sensitivity and some particularities (e.g. a hole HL) may become apparent based on such an non-uniform "image" interpretation.

FIGS. 6.A and 6.B schematically illustrate the magneto-optic sensor according to a fourth embodiment of the invention. The fourth embodiment relates to a magneto-optic sensor working in transmission coupled to a plurality of optical fibers.

The magneto-optic sensor 101' is coupled to a first 110A, second 110B, third 110C and fourth 110D optical fibers and respectively receives a first $IB_A$, second $IB_B$, third $IB_C$ and fourth $IB_D$ incident beam provided by at least one source of an electronic unit (not shown). The magneto-optic sensor 101' comprises a polarizing element 103 (e.g. a polarizer), a Faraday rotator 104, an analyzing element 107 (e.g. an analyzer). It may comprise a plurality of beam shaping elements 102A, 102B, 102C, 102D coupled to the respective optical fiber 110A, 110B, 110C, 110D. The beam shaping elements may be for example collimators, focusers, lenses or particular extremities of the respective optical fibers 110A, 110B, 110C, 110D. For example, they may be designed to focus the respective incident beams onto the analyzer and onto the faraday rotator. The sensor may also comprise a determined magnetic field generator 106, for example a permanent magnet. The magneto-optic sensor 101' provides a first $RB_A$, second $RB_B$, third $RB_C$ and fourth $RB_D$ response beam onto a detector 115. The detector may be a charged coupled device (CCD) type detector or a plurality of detectors, each detector being associated with one optical fiber. The detector 115 provides a signal that can be processed in order to show an "image" representative of the local magnetic field. The detector 115 is coupled by an electrical wire 116 to the electronic unit (not shown).

The polarizing element 103, the Faraday rotator 104, the determined magnetic field generator 106 and the analyzing element 107 are analog to the ones described in relation with the first embodiment of the invention and will not be further described. The above mentioned individual components are positioned and secured in an appropriate housing through known mechanical or gluing techniques.

The magneto-optic sensor according to the fourth embodiment operates as follows. The first $IB_A$, second $IB_B$, third $IB_C$ and fourth $IB_D$ incident beams respectively provided by the first 110A, second 110B, third 110C and fourth 110D optical fibers are respectively shaped through the beam shaping elements 102A, 102B, 102C, 102D. The first $IB_A$, second $IB_B$, third $IB_C$ and fourth $IB_D$ incident beams travel through the polarizing element 103 and are linearly polarized. Subsequently, the first $IB_A$, second $IB_B$, third $IB_C$ and fourth $IB_D$ incident beams travel through the Faraday rotator 104 which rotates the polarization of the first $IB_A$, second $IB_B$, third $IB_C$ and fourth $IB_D$ incident beams.

According to FIG. 6.A, the magneto-optic sensor 101' is positioned along a casing joint CJ3. The Faraday rotator 104 provides a plurality of beams which polarizations are rotated by an angle of rotation depending on the permanent magnetic field B applied on the Faraday rotator. Then, said beams travel through the analyzing element 107 which transmits only the polarization components corresponding to its polarization angle. The resulting first $RB_A$, second $RB_B$, third $RB_C$ and fourth $RB_D$ response beam respectively have an intensity $I_{rA}$, $I_{rB}$, $I_{rC}$, $I_{rD}$ modified in correlation with the magnetic field locally applied on the Faraday rotator. The sensor 101' provides the first $RB_A$, second $RB_B$, third $RB_C$ and fourth $RB_D$ response beam onto the detector 115. Typically, in case of a normal casing, the detector may show a uniform "image" of the casing.

According to FIG. 6.B, the magneto-optic sensor 101' is positioned close by a corroded zone CR. The magnetic anomaly caused by the corroded zone CR disturbs the determined magnetic field B and results in a different magnetic field B' applied on the Faraday rotator. Locally, the magnetic field B' may differ substantially due to particular anomaly, for example a hole HL in the casing. The Faraday rotator 104 provides a plurality of beams which polarizations are rotated by a different angle of rotation depending on the local magnetic field applied on the Faraday rotator. The resulting beams travel through the analyzing element 107 and polarization components of different intensity $I_{rA}'$, $I_{rB}'$, $I_{rC}'$, $I_{rD}'$ are transmitted. Consequently, the proximity of a corroded zone to the magneto-optic sensor 101' can be detected as a variation in the transmitted intensity of the response beams $RB'_A$, $RB'_B$, $RB'_C$, $RB'_D$. Typically, in case of a corroded casing, the detector may show a non-uniform "image" of the casing. The position, the shape and the dimensions of the corroded zone CR can be determined with a high sensitivity and some particularities (e.g. a hole HL) may become apparent based on such an non-uniform "image" interpretation.

The third and fourth embodiments have been hereinbefore described with four optical fibers in the same plan. However, it will apparent for a man skilled in the art that the sensor 101, 101' may be coupled to a different number of optical fibers, and that the optical fibers can be positioned so as to give an "image" of a surface of the casing. Obviously, increasing the number of optical fibers will enable to obtain "images" of better spatial resolution.

Advantageously, positioning a main axis of the sensor of the third and fourth embodiments sensibly perpendicularly to a well-bore main axis at the level of a zone where measurements are performed enables to obtain a good spatial resolution.

FIGS. 5 and 6 have been hereinbefore described with a particular focus of a magneto-optic sensor implemented in a corrosion locator. However, it is apparent for a man skilled in the art that the same magneto-optic sensor can also be implemented in a casing collar locator. Thus, the third and fourth embodiments of the magneto-optic sensor of the invention operate in an identical manner for detecting the magnetic anomaly created by a casing collar and will not be further described.

As alternative for the hereinbefore described embodiments, the optical fiber between the sensor and the electronic unit may be omitted. In this case, the electronic unit is directly coupled to the sensor, said sensor being directly provided with an incident beam by a beam source and the response beam being directly detected by a detector. This detector may be a charged coupled device (CCD) type detector.

The magneto-optical sensor of the hereinbefore described embodiments can be designed as a reduced size sensor (e.g. a few millimeters), enabling the sensor to be positioned very close to the casing wall by, for example, a deploying arm or a centralizer arm (see FIG. 2.B) or a finger of a caliper.

Thus, the sensitivity of the magneto-optical sensor is improved and local measurements can be performed.

All the individual components of the magneto-optic sensor of the first to fourth embodiment may be chosen to withstand high temperature environment and are thus well-adapted for down-hole applications. Further, all the optical components may be treated with antireflective coating for minimizing parasitic signals.

Figure 8:
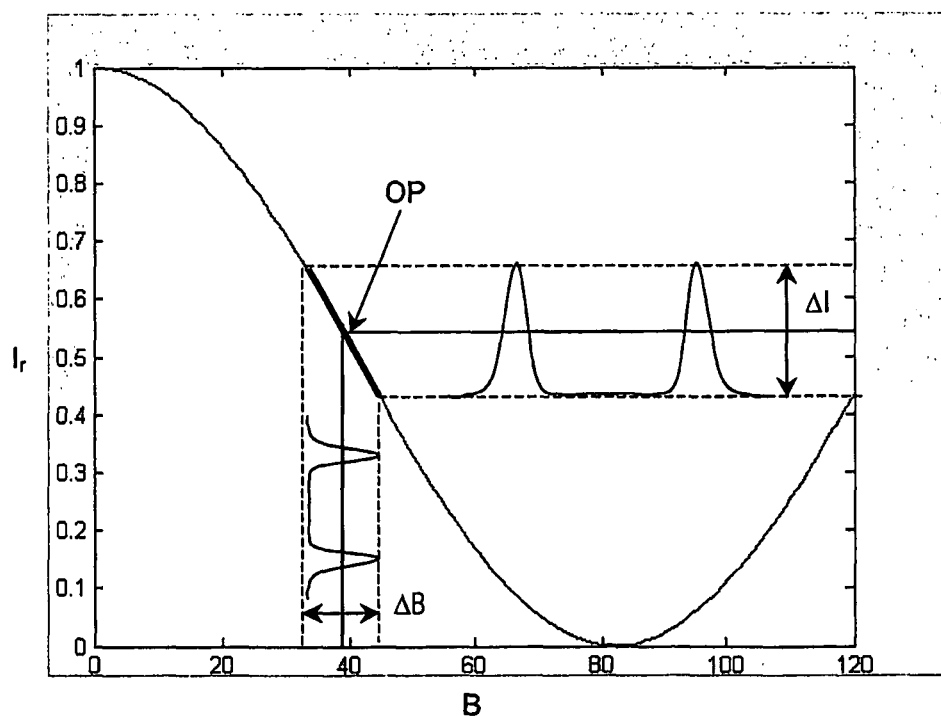
FIG. 8 represents a graphic illustrating the response of the magneto-optic sensor of the invention.

FIG. 8 represents a graphic illustrating the response of the magneto-optic sensor of the invention, namely the reflected intensity $I_r$ versus the magnetic field B applied on the Faraday rotator.

The sensor response is described by the mathematical relationship as follow:

$$I_r = I_i \cdot 2 \cdot \cos^2(2\theta) = I_i \cdot 2 \cdot \cos^2(2\alpha B)$$

where $I_i$ is the incident intensity of the incident beam IB, $I_r$ is the reflected intensity of the response beam RB, $\alpha$ is the sensitivity of the Faraday rotator and B is the magnetic field applied on the Faraday rotator.

The magneto-optical sensor operating point OP can be set by applying a constant magnetic field on the Faraday rotator. In this case, the sensitivity of the Faraday rotator can be optimized. The constant magnetic field is applied through the determined magnetic field generator, for example a permanent magnet.

Figure 9:
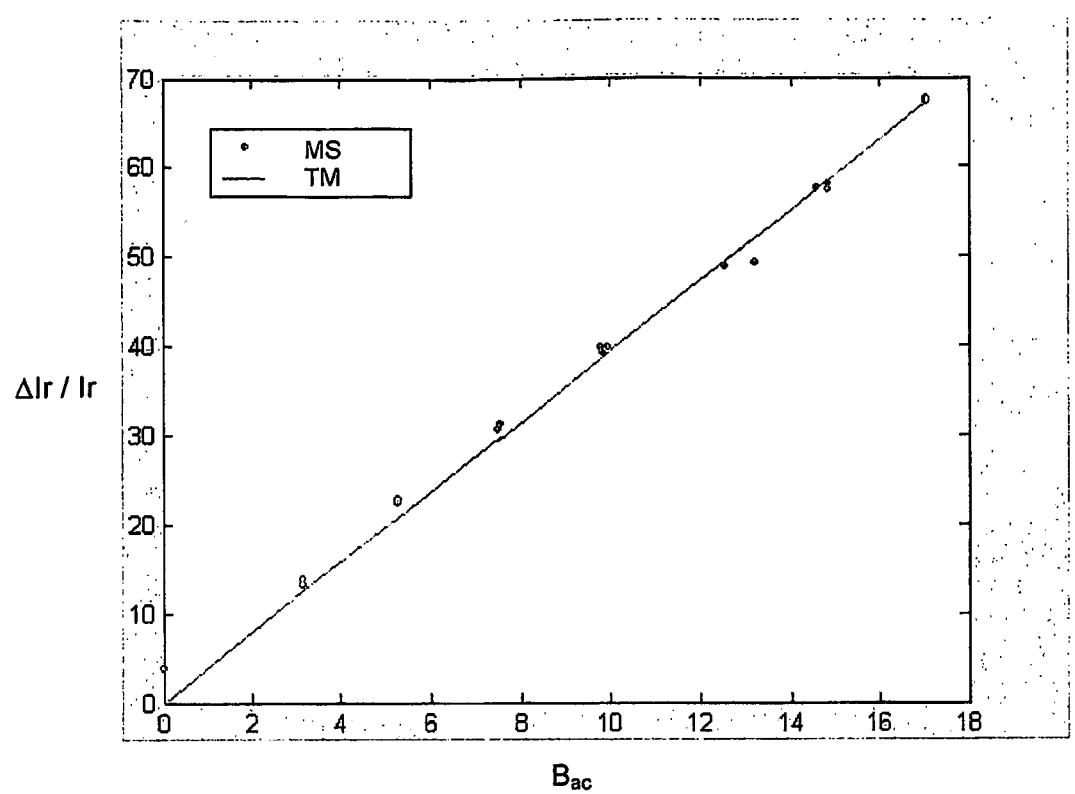
FIG. 9 represents a graphic illustrating the sensitivity of the magneto-optic sensor of the invention.

FIG. 9 represents a graphic illustrating the sensitivity of the magneto-optic sensor of the invention. More precisely the relative intensity variation $\Delta I_r/I_r$ versus a variable external magnetic $B_{ac}$ field for a given constant magnetic field applied on the Faraday rotator are measured. The measurements MS are compared to the theorical model TM, namely:

$$\frac{\Delta I_r}{I_r} = \alpha B_{ac} \tan(2\alpha B_{dc})$$

where $I_r$ is the reflected intensity of the response beam RB, $\alpha$ is the sensitivity of the Faraday rotator, $B_{dc}$ is the constant magnetic field applied on the Faraday rotator and $B_{ac}$ is the external variable magnetic field applied on the Faraday rotator.

With the magneto-optical sensor of the invention, a change in intensity of 20% corresponds to an amplitude modulation of around 5 Gauss. The magneto-optical sensor of the invention also presents an absence of measurement hysteresis.

FIG. 8 also shows that an alternative of the hereinbefore described embodiments of the invention in which no determined magnetic field is applied to the Faraday rotator would also give satisfactory results (namely a correct detection of casing collars an/or corroded casing joint) though having less sensitivity. Thus, the determined magnetic field generator can be omitted. In this case, the Faraday rotator is only submitted to the external magnetic field.

FINAL REMARKS

In the hereinbefore description of the various embodiments of invention, the sensor was shown sensibly along the casing or sensibly perpendicular to the casing for clarity purpose.

However, it will be apparent for a man skilled in the art that the sensor would also give satisfactory results when tilted into the well-bore. For example, any angle may be formed between a main sensor axis and a main well-bore axis while performing the measurements.

The hereinbefore described sensors comprise a determined magnetic field generator under the form of a permanent magnet or a coil generating a permanent or constant magnetic field. These sensors measure an external magnetic field or an anomaly in the magnetic field due to the presence of a collar or corroded joint. However, the sensors can be submitted to a determined magnetic field of alternative type. This alternative magnetic field may be generated by a determined magnetic field generator under the form of a transmitter coil. The generator can be positioned in the sensor, close to the sensor or inside the tool. In this alternative, the sensor detects the variation of the magnetic field due to the induced Eddy currents. In addition, it may also be advantageous to perform various measurements at the same position within the well-bore with a determined magnetic field of alternative type at various frequencies.

In addition, the position, the shape and the dimensions of corroded zones can be determined with a high sensitivity and with a high spatial resolution because the sensor can be easily fitted inside of an arm and thus positioned close to the casing while not being pressed against the casing.

In the above description of the invention, a casing collar locator or a corrosion locator comprising a single magneto-optical sensor have been described. However, it will be apparent for a man skilled in the art that a plurality of magneto-optical sensors can be coupled together or that a magneto-optical sensor can be coupled with others types of sensors, the sensors being coupled to a single electronic unit by at least one optical fiber. In such multiple sensors architectures, known multiplexing techniques (e.g. Wavelength Division Multiplexing technique, Time Domain Multiplexing technique, selective filtering technique or selective mirror technique) are implemented to control and differentiate the various response beams provided by each sensor.

In the above description of the invention, the various components have been described as individual components. However, it will be apparent for a man skilled in the art that these components can be integrated in a unique micro-optic assembly, for example through the hybrid integration of Faraday rotator crystals or waveguides with polarizing element, thin film magnets and optical fiber or planar silica-based waveguides. Further, the Faraday rotator can be an assembly of thin Faraday rotator stacked together.

A particular application of the invention relating to oilfield industry has been described. However, the invention is also applicable for the measurements into any other type of pipe (water pipe, sewer pipe, etc. . . . ).

The drawings and their description hereinbefore illustrate rather than limit the invention.

Any reference sign in a claim should not be construed as limiting the claim. The word "comprising" does not exclude the presence of other elements than those listed in a claim. The word "a" or "an" preceding an element does not exclude the presence of a plurality of such element.

The invention claimed is:

1. A magneto-optic sensor for oilfield application, the sensor receiving an incident beam and comprising:
   a polarizing element for polarizing the incident beam to provide a first beam having a determined state of polarization;

a Faraday rotator for rotating the polarization of the first beam to provide a second beam having a modified state of polarization; and a magnetic field generator configured to submit the Faraday rotator to a constant magnetic field, wherein the sensor provides a response beam obtained by passing the second beam through the polarizing element and having an intensity dependent on an external magnetic field representative of a particular characteristic of a well-bore casing applied on the Faraday rotator, wherein a sensor operating point is set on a linear portion of a sensor response curve so as to optimize a sensitivity of the sensor.

2. A magneto-optic sensor for oilfield application according to claim 1, wherein the sensor further comprises at least one beam shaping element for shaping the incident beam onto the polarizing element, said beam shaping element being a collimator, a focuser, a lens or a particular extremity of an optical fiber.

3. A magneto-optic sensor for oilfield application according to claim 1, wherein:
the sensor is coupled to an electronic unit,
the electronic unit comprises at least one source providing the incident beam to the sensor and at least one detector receiving the response beam from the sensor.

4. A magneto-optic sensor for oilfield application according to claim 1, wherein:
the sensor is coupled to an electronic unit by at least one optical fiber,
the electronic unit comprises at least one source providing at least one incident beam carried by the optical fiber to the sensor and at least one detector receiving the at least one response beam carried by the optical fiber from the sensor, the source and the detector being coupled to the optical fiber by a coupler, and
the sensor comprises a reflective element for reflecting the response beam to the optical fiber.

5. A magneto-optic sensor for oilfield application according to claim 4, wherein the reflective element is a corner cube reflector.

6. A magneto-optic sensor for oilfield application according to claim 1, wherein:
the sensor further comprises an analyzing element,
the sensor is coupled to an electronic unit by a first and a second optical fiber, and
the electronic unit comprises at least one source providing the incident beam carried by the first optical fiber to the sensor and at least one detector receiving the response beam carried by the second optical fiber from the sensor.

7. A magneto-optic sensor for oilfield application according to claim 1, wherein:
the sensor is coupled to an electronic unit by at least two optical fibers,
the electronic unit comprises at least one source providing at least two incident beams respectively carried by the at least two optical fibers to the sensor,
the sensor provides at least two response beams having an intensity dependent on the external magnetic field representative of a particular characteristic of the well-bore casing locally applied on the Faraday rotator, and
the sensor comprises at least one detector receiving the response beams.

8. A magneto-optic sensor for oilfield application according to claim 1, wherein the sensor has a main axis positioned sensibly parallel to a well-bore main axis at the level where the external magnetic field representative of the particular characteristic of the well-bore casing is measured.

9. A magneto-optic sensor for oilfield application according to claim 1, wherein the sensor has a main axis positioned sensibly perpendicularly to a well-bore main axis at the level where the external magnetic field representative of the particular characteristic of the well-bore casing is measured.

10. A magneto-optic sensor for oilfield application according to claim 1, wherein the particular characteristic is a casing collar coupling a first casing joint to a second casing joint.

11. A magneto-optic sensor for oilfield application according to claim 1, wherein the particular characteristic is a corroded casing joint.

12. A logging method for determining a particular characteristic of a well-bore casing, the method comprising the steps of deploying a logging apparatus comprising a tool coupled to a surface unit by a line in the well-bore, wherein the method further comprises the step of detecting the particular characteristic of the well-bore casing by at least one corrosion locator comprising a housing fitted with a magneto-optic sensor according to claim 1, the magneto-optic sensor providing a first response signal when the magneto-optic sensor is positioned along a normal state casing joint and a second response signal when the magneto-optic sensor is positioned close by a corroded state casing joint.

13. A magneto-optic sensor for oilfield application, the sensor receiving an incident beam and comprising:
a polarizing element for polarizing the incident beam to provide a first beam having a determined state of polarization;
a Faraday rotator for rotating the polarization of the first beam to provide a second beam having a modified state of polarization; and
a magnetic field generator configured to submit the Faraday rotator to a constant magnetic field, wherein the sensor provides a response beam obtained by passing the second beam through the polarizing element and having an intensity dependent on an external magnetic field representative of a particular characteristic of a well-bore casing applied on the Faraday rotator, wherein the sensor is configured to induce a zero response beam when the sensor is positioned close to a casing joint and to induce a non-zero response beam when the sensor is positioned close to a casing collar.

14. A magneto-optic sensor for oilfield application according to claim 13, wherein the sensor is configured to detect the presence of a casing collar based on a variation in the intensity of the response beams.

15. A magneto-optic sensor for oilfield application, the sensor receiving an incident beam and comprising:
a polarizing element for polarizing the incident beam to provide a first beam having a determined state of polarization;
a Faraday rotator for rotating the polarization of the first beam to provide a second beam having a modified state of polarization; and
a magnetic field generator configured to submit the Faraday rotator to a constant magnetic field, wherein the sensor provides a response beam obtained by passing the second beam through the polarizing element and having an intensity dependent on an external magnetic field representative of a particular characteristic of a well-bore casing applied on the Faraday rotator, wherein the magnetic field generator comprises a magnet assembly comprising two hollow cylindrical magnets encompassing the Faraday rotor.

16. A magneto-optic sensor for oilfield application according to claim 15, wherein the magnet assembly comprises Samarium Cobalt material.

17. A magneto-optic sensor for oilfield application according to claim 15, wherein magnetic field generator comprises a spool arrangement and an alimentation circuit.

\* \* \* \* \*